(12) United States Patent
Mamitsu et al.

(10) Patent No.: US 7,091,603 B2
(45) Date of Patent: Aug. 15, 2006

(54) SEMICONDUCTOR DEVICE

(75) Inventors: Kuniaki Mamitsu, Okazaki (JP); Yoshimi Nakase, Anjo (JP)

(73) Assignee: Denso Corporation, Kariya (JP)

( * ) Notice: Subject to any disclaimer, the term of this patent is extended or adjusted under 35 U.S.C. 154(b) by 26 days.

(21) Appl. No.: 11/012,091

(22) Filed: Dec. 16, 2004

(65) Prior Publication Data

US 2005/0145999 A1    Jul. 7, 2005

(30) Foreign Application Priority Data

Dec. 24, 2003    (JP) .............................. 2003-427311

(51) Int. Cl.
*H01L 23/10* (2006.01)
*H01L 23/28* (2006.01)

(52) U.S. Cl. ............... 257/706; 257/276; 257/625; 257/707; 257/712; 257/713; 257/717; 257/719; 257/720; 257/796; 257/E23.075; 257/E31.131

(58) Field of Classification Search ............... 257/276, 257/625, 675, 706, 707, 712–722, 796, E23.075, 257/E31.131, E23.051, E23.08, E23.113, 257/667

See application file for complete search history.

(56) References Cited

U.S. PATENT DOCUMENTS

| 5,369,550 | A | * | 11/1994 | Kwon | ........................ 361/690 |
| 5,594,274 | A |   | 1/1997 | Suetaki | |
| 6,011,312 | A | * | 1/2000 | Nakazawa et al. | .......... 257/778 |
| 6,459,144 | B1 | * | 10/2002 | Pu et al. | ...................... 257/667 |
| 6,693,350 | B1 | * | 2/2004 | Teshima et al. | ............ 257/712 |
| 6,960,825 | B1 | * | 11/2005 | Mamitsu et al. | ............ 257/718 |
| 2003/0022464 | A1 |   | 1/2003 | Yutaka et al. | |
| 2003/0122232 | A1 |   | 7/2003 | Shoji et al. | |

FOREIGN PATENT DOCUMENTS

| JP | 3-60146 | * | 3/1991 | ................. 257/796 |
| JP | 4-107931 | * | 4/1992 | |

\* cited by examiner

*Primary Examiner*—Jasmine Clark
(74) *Attorney, Agent, or Firm*—Posz Law Group, PLC

(57) ABSTRACT

In a semiconductor device having semiconductor chips, a lower heat sink which is joined on the principal rear surface side of the semiconductor chips and an upper heat sink which is joined on the principal front surface side of the semiconductor chips, wherein substantially the whole device is encapsulated with a molded resin, the thick-walled portion of a resin lying around a mounted portion is provided with holes which are resin-flow hindering portions for hindering the flow of the resin during the molding thereof, whereby air bubbles are prevented from appearing in the resin within the mounted portion.

8 Claims, 9 Drawing Sheets

"SEMICONDUCTOR DEVICE

CROSS REFERENCE TO RELATED APPLICATION

This application is based upon, claims the benefit of priority of, and incorporates by reference the contents of Japanese Patent Application No. 2003-427311 filed on Dec. 24, 2003.

FIELD OF THE INVENTION

The present invention relates to a semiconductor device having a first metal member and a second metal member respectively joined on the principal rear surface side and principal front surface side of semiconductor elements, which have electrodes on the principal front surface and rear surface sides, all of which are encapsulated with a resin.

BACKGROUND OF THE INVENTION

Recently, a reduction in size of a semiconductor element has been required in order to satisfy demands for a decrease in costs.

Since, however, the miniaturization of the semiconductor element incurs rises in heat generation density and current density, problems to be stated below are involved in prior-art structures wherein wire bonding connections to the semiconductor element are employed, and wherein heat is radiated by disposing a heat sink on one surface of the semiconductor element.

First, with the wire bonding connections, areas in which wires can be bonded become small due to the miniaturization of the semiconductor element, and a rated current is limited by the wires. This gives rise to such a problem that a large current to flow through the semiconductor element is difficult of attainment.

On the other hand, with the construction wherein the heat is radiated by disposing the heat sink on one surface of the semiconductor element, heat radiativity lowers due to the miniaturization of the semiconductor element. Another problem is that, since the heat generation density of the semiconductor element rises, the temperature thereof rises. Accordingly, the construction adversely affects the thermal fatigue lifetime of bonding wire or solder joints.

In order to solve the above problems, therefore, a structure wherein metal members which serve as electrodes and radiation members are soldered on both the sides of semiconductor elements has been proposed as a structure which unites an enhanced heat radiativity based on dual-side-radiating and electric connections based on soldering.

FIGS. 9A and 9B illustrate the general construction of a semiconductor device of this type, in which FIG. 9A is a schematic plan view, and FIG. 9B is a schematic sectional view taken along line IXB—IXB in FIG. 9A.

A semiconductor device disclosed in, for example, JP-A-2001-156219 or JP-A-2003-110064, the contents of which are incorporated herein by reference, has been proposed as the semiconductor device as shown in FIGS. 9A and 9B.

The semiconductor device shown in FIGS. 9A and 9B includes semiconductor elements 10, 11 which have electrodes on a principal front surface and a principal rear surface, respectively, a first metal member 20 which is joined on the principal rear surface side of the semiconductor elements 10, 11 and which serves as an electrode and a radiation member, and a second metal member 30 which is joined on the principal front surface side of the semiconductor elements 10, 11 and which serves as an electrode and a radiation member, and it has a dual-side-radiating molded structure in which the device is substantially wholly encapsulated with a mold resin 80.

Here in the semiconductor device shown in FIGS. 9A and 9B, the second metal member 30 is joined in a state where a third metal member 40 is interposed between this second metal member 30 and the principal front surface of the semiconductor elements 10, 11. Further, one side of the semiconductor elements 10 is connected to signal terminals 60 made of lead frames or the like, through bonding wires 70 within the resin 80.

Further, the semiconductor elements 10, 11 and the metal members 20, 30, 40 are joined to each other through conductive joint members 50 made of a solder or the like, and the joints between them are electrical and thermal joints.

In the semiconductor device having the dual-side-radiating molded structure, therefore, the semiconductor elements 10, 11 are permitted to radiate heat from both the principal front and rear surfaces and to be electrically led out from both the principal front and rear surfaces. Accordingly, the semiconductor device is effective in enhancing its heat radiativity and heightening its current density.

Meanwhile, in the case of the semiconductor device shown in FIGS. 9A and 9B, a part 90 not in the resin 80 (hereinbelow, the part shall be termed "mounted portion 90") is set in a metal mold, and the resin 80 is poured into the metal mold so as to fill up this metal mold. That is, the resin (mold resin) 80 is molded by molding.

In the case of filling up the metal mold with the mold resin 80, however, there occurs the manufacturing problem that air bubbles remain within the resin 80 for the following reasons:

In the dual-side-radiating molded structure, the metal members 20, 30 are respectively exposed to the rear and front surfaces of the resin 80. Besides, since the metal members 20, 30 function also as the electrodes, an electric field acts across the exposed parts.

As shown in FIG. 9B, therefore, the resin 80 is formed with a thick-walled portion around the metal members 20, 30, namely, at the outer peripheral part of the resin 80, in order to obtain an interval along the surfaces which is necessary for the electrical insulation between the rear metal member 20 and the front metal member 30. Consequently, a distance (Wa+t+Wb) is secured in design as the sum of individual dimensions Wa, t and Wb indicated in the figure.

In this manner, in the semiconductor device of this type, the outer peripheral part of the resin 80 is made of the thick-walled portion, and the part of the resin 80 lying within the mounted portion 90 is made of a thin-walled portion as compared with the thick-walled portion.

Here, let's consider the molding of the mold resin 80. As shown in FIG. 10, in the thick-walled portion which has a large cross-sectional area as viewed in the flowing direction of the resin 80, the flow of the resin 80 is easy in the molding operation, whereas in the mounted portion 90, its cross-sectional area is small due to the existence of the rear and front metal members 20, 30 and the semiconductor elements 10, 11, and the flow of the resin 80 is hindered.

As shown in FIG. 10, therefore, the filling with the resin 80 becomes unbalanced in such a manner that the resin 80 circulates comparatively fast in the thick-walled portion within the metal mold. Besides, the final filling part of the resin 80 extends inside the mounted portion 90, and the air bubbles remain in the resin 80 within the final filling part inside the mounted portion 90. Such air bubbles affect the withstand voltage characteristic, etc. of the semiconductor device, and become problematic in the reliability thereof.

SUMMARY OF THE INVENTION

In view of the above problems, it is an object to prevent air bubbles from appearing in a resin inside a mounted portion to the utmost in a semiconductor device having a dual-side-radiating molded structure.

The invention has been made with note taken of the fact that, in a resin molding operation, a resin flows faster in the thick-walled portion of the resin around a mounted portion, than in the thin-walled portion of the resin within the mounted portion, so the interior of the mounted portion becomes the final filling part of the resin molding operation and leave air bubbles behind there, and that portions which appropriately hinder the resin flow are therefore provided in the thick-walled portion so as to uniformalize the velocity of the flow of the resin at the thick-walled portion and the thin-walled portion to the utmost.

In order to accomplish the object, a semiconductor device according to a first aspect includes semiconductor elements having electrodes on a principal front surface and a principal rear surface, respectively; a first metal member which is joined on a principal rear surface side of the semiconductor elements, and which serves as an electrode and a radiation member; and a second metal member which is joined on a principal front surface side of the semiconductor elements, and which serves as an electrode and a radiation member; wherein substantially the whole device is encapsulated with a molded resin; characterized by comprising resin-flow hindering portions for hindering a flow of the resin during molding thereof, which portions are provided in a thick-walled portion of the resin lying at a peripheral part of the semiconductor device.

According to the semiconductor device, the resin-flow hindering portions for hindering the flow of the resin during the molding thereof are provided in the thick-walled portion of the resin lying at the peripheral part of the semiconductor device. In the resin molding operation, therefore, the flow of the resin can be made slower than in the prior art at the part to become the thick-walled portion, and the velocity of the flow of the resin at the part to become the thick-walled portion and the part to become the thin-walled portion can be made uniform as best as possible.

Accordingly, the air bubbles can be prevented from appearing in the mounted portion, to the utmost in the semiconductor device which has the dual-side-radiating molded structure.

According to a second aspect, in the semiconductor device as defined in the first aspect, the resin-flow hindering portions can be made holes which are formed in the thick-walled portion within the resin.

In this case, the holes can be easily formed in the thick-walled portion within the resin through a metal mold provided with convex parts corresponding to the holes. Further, in this case, the flow of the resin is hindered in such a manner that the resin collides against the convex parts of the metal mold.

Further, according to a third aspect, in the semiconductor device as defined in the second aspect, the holes can be made recesses which are formed in end surfaces of the thick-walled portion within the resin.

Further, according to a fourth aspect, in the semiconductor device as defined in the first aspect, the resin-flow hindering portions can be made insulator portions which are embedded in through holes that penetrate through the device in a thickness direction thereof, in the thick-walled portion within the resin.

In this case, when the insulator portions are sandwiched in between the upper and lower molds of a metal mold, they can be set in the metal mold, and the resin is poured into the metal mold, whereby the flow of the resin is hindered by the insulator portions.

Besides, in the resin after the molding, the resin-flow hindering portions in which the insulator portions are embedded in the through holes are consequently formed in the thick-walled portion within the resin.

Accordingly, the semiconductor device according to the above aspects has the advantage that the prior-art metal mold left intact can be used without especially altering the construction thereof.

In addition, according to a fifth aspect, in the semiconductor device as defined in the first aspect, the resin-flow hindering portions can be made thin-walled portions formed when outer peripheral parts of the thick-walled portion in the resin are thinned.

Also in this case, when the shape of a metal mold is altered in correspondence with the thin-walled portions, these thin-walled portions being the resin-flow hindering portions can be easily formed at the outer peripheral parts of the thick-walled portion in the resin. Herein, when the widthwise dimensions of the thin-walled portions are held appropriately, an interval along the surfaces can be easily secured.

According to a sixth aspect, in the semiconductor device as defined in the first aspect, the resin-flow hindering portions can be made metal pieces which are embedded in the thick-walled portion within the resin.

Since, in this case, the resin-flow hindering portions are made the metal pieces, they can be soldered to the metal members in a mounted portion, or they can be molded integrally with the metal members, whereby they can be fixed to the mounted portion. Besides, in this case, the flow of the resin is hindered by the metal pieces.

In this manner, also in this case, the resin-flow hindering portions can be formed merely by setting the mounted portion to which the metal pieces are fixed, in a metal mold, and then pouring the resin. Accordingly, there is the advantage that the prior-art metal mold left intact can be used without especially altering the construction thereof.

According to a seventh aspect, in the semiconductor device as defined in the sixth aspect, the metal pieces can be formed integrally with the first metal member or the second metal member.

According to the semiconductor device, the metal pieces are made integral with the first metal member or second metal member, whereby the volume of the first metal member or second metal member being the radiation member is increased, to bring forth the advantage that the thermal resistance of the metal member is lowered.

According to an eighth aspect, in the semiconductor device as defined in any of the first to seventh aspects, the second metal member can be joined in a state where third metal members are interposed between the second metal member and the principal front surface of the semiconductor elements.

BRIEF DESCRIPTION OF THE DRAWINGS

FIGS. 1A and 1B illustrate the schematic construction of a semiconductor device according to a first embodiment, in which FIG. 1A is a schematic plan view showing the planar arrangement of individual portions, and FIG. 1B is a schematic sectional view taken along line IB—IB in FIG. 1A;

FIGS. 2A and 2B illustrate the schematic construction of a semiconductor device according to a second embodiment, in which FIG. 2A is a schematic plan view showing the planar arrangement of individual portions, and FIG. 2B is a schematic sectional view taken along line IIB—IIB in FIG. 2A;

FIGS. 3A and 3B illustrate the schematic construction of a semiconductor device according to a third embodiment, in which FIG. 3A is a schematic plan view showing the planar arrangement of individual portions, and FIG. 3B is a schematic sectional view taken along line IIIB—IIIB in FIG. 3A;

FIGS. 4A and 4B illustrate the schematic construction of a semiconductor device according to a fourth embodiment, in which FIG. 4A is a schematic plan view showing the planar arrangement of individual portions, and FIG. 4B is a schematic sectional view taken along line IVB—IVB in FIG. 4A;

FIGS. 5A and 5B illustrate the schematic construction of a semiconductor device according to a fifth embodiment, in which FIG. 5A is a schematic plan view showing the planar arrangement of individual portions, and FIG. 5B is a schematic sectional view taken along line VB—VB in FIG. 5A;

FIGS. 6A and 6B illustrate the schematic construction of a semiconductor device according to the sixth embodiment, in which FIG. 6A is a schematic plan view showing the planar arrangement of individual portions, and FIG. 6B is a schematic sectional view taken along line VIB—VIB in FIG. 6A;

FIGS. 8A and 8B illustrate the schematic construction of a semiconductor device according to the seventh embodiment, in which FIG. 8A is a schematic plan view showing the planar arrangement of individual portions, and FIG. 8B is a schematic sectional view taken along line VIIIB—VIIIB in FIG. 8A;

FIGS. 9A and 9B illustrate the general construction of a prior art semiconductor device, in which FIG. 9A is a schematic plan view, and FIG. 9B is a schematic sectional view taken along line IXB—IXB in FIG. 9A.

DESCRIPTION OF THE PREFERRED EMBODIMENTS

Now, embodiments of the present invention will be described with reference to the drawings. Incidentally, throughout the drawings, the same numerals and signs shall be assigned to parts identical or equivalent to one another in the ensuing embodiments, for the sake of the brevity of the description.

In each plan view to be referred to below, white arrows indicate the positions of resin filling ports, namely, gates in a metal mold for a resin molding operation, and the situation of the flow of a resin which is poured through the gates.

In each plan view to be referred to below, an example of the metal mold having three gates is shown, but the invention shall not be restricted to the example. Also, in each of the plan views to be referred to below, a third conductive joint member 53 which underlies semiconductor chips 10, 11 is omitted from illustration.

First Embodiment

Figure 1A:
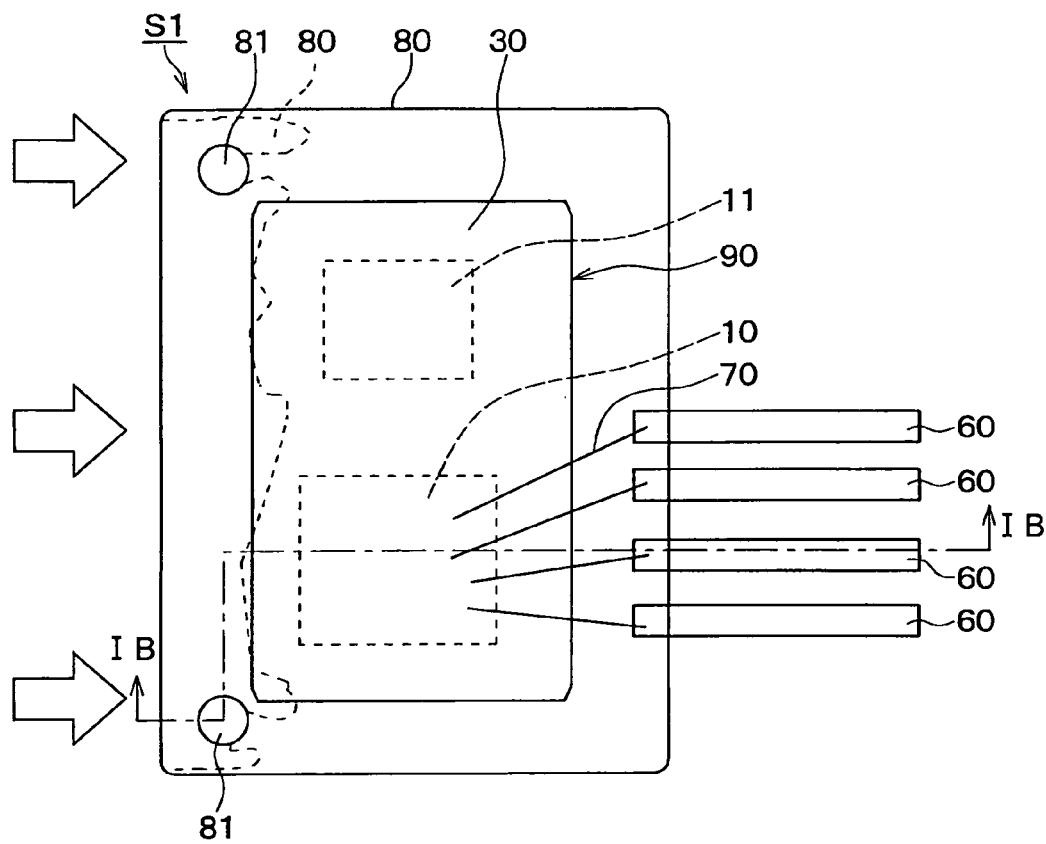
Figure 1B:
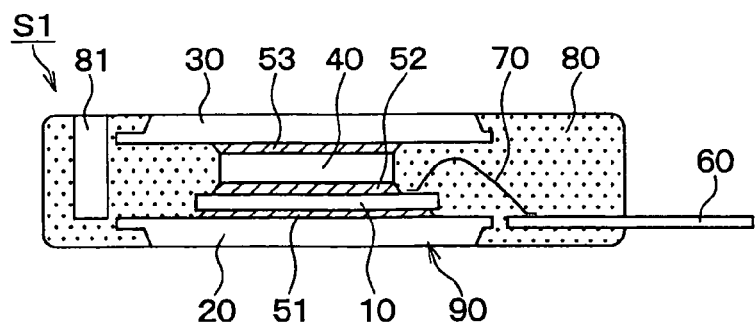

FIGS. 1A and 1B illustrate the schematic construction of a semiconductor device S1 according to the first embodiment, in which FIG. 1A is a schematic plan view showing the planar arrangement of individual portions, and FIG. 1B is a schematic sectional view taken along line IB—IB in FIG. 1A.

As shown in FIGS. 1A and 1B, the semiconductor device S1 of this embodiment includes semiconductor chips 10, 11 which are semiconductor elements, a lower heat sink 20 which is a first metal member, an upper heat sink 30 which is a second metal member, and a mold resin 80.

Here in this embodiment, heat sink blocks 40 are interposed between the semiconductor chips 10, 11 and the upper heat sink 30, and the semiconductor chips 10, 11 are joined with the upper heat sink 30 through the heat sink blocks 40.

Incidentally, although not shown in FIG. 1B, the second semiconductor chip 11 is joined to the upper heat sink 30 through the heat sink block 40 in a manner similar to the first semiconductor chip 10. Regarding the situation of the second semiconductor chip 11, reference should be made to FIG. 5, etc. as will be explained later.

In the case of the illustrated construction, the lower surface of the semiconductor chips 10, 11 and the upper surface of the lower heat sink 20 are joined by a first conductive joint member 51.

The upper surface of the semiconductor chips 10, 11 and the lower surface of each heat sink block 40 are joined by a second conductive joint member 52.

Further, the upper surface of each heat sink block 40 and the lower surface of the upper heat sink 30 are joined by a third conductive joint member 53.

Here, a solder, a conductive adhesive, or the like can be adopted for the first, second and third conductive joint members 51, 52 and 53. In the semiconductor device of this example, a Sn (tin)-based solder is employed for the first, second and third conductive joint members 51, 52 and 53.

Thus, in the construction, at the upper surface of the semiconductor chips 10, 11, heat is radiated through the second conductive joint member 52, heat sink blocks 40, third conductive joint member 53 and upper heat sink 30, while at the lower surface of the semiconductor chips 10, 11, heat is radiated through the lower heat sink 20 from the first conductive joint member 51.

Here, although not especially restricted, the first semiconductor chip 10 can be constructed of, for example, an IGBT (insulated-gate bipolar transistor) or a power semiconductor element such as thyristor. Also, the second semiconductor chip 11 can be constructed of, for example, an FWD (free-wheel diode).

Concretely, each of the semiconductor chips 10, 11 can be brought into, for example, the shape of a rectangular thin plate. In FIG. 1B, the upper surface side of the semiconductor chips 10, 11 forms a principal front surface being an element forming surface, and the lower surface side thereof forms a principal rear surface. Each of the semiconductor chips 10, 11 has electrodes on the principal front surface and principal rear surface.

That is, in this embodiment, the electrodes of the semiconductor chips 10, 11 on the principal rear surface side are electrically connected to the lower heat sink 20 being the first metal member, through the first conductive joint member 51, while the principal electrodes of the semiconductor chips 10, 11 on their principal front surface side are electrically connected to the heat sink blocks 40 through the second conductive joint member 52.

Further, on the side of the heat sink blocks 40 away from the semiconductor chips 10, 11, these heat sink blocks 40 and the upper heat sink 30 being the second metal member are electrically connected through the third conductive joint member 53.

Here, the lower heat sink 20, upper heat sink 30 and heat sink blocks 40 are made of a metal having high thermal conductivity and electric conductivity such as, for example, a copper alloy or an aluminum alloy. Alternatively, a general iron alloy may well be employed for the heat sink blocks 40.

Besides, the lower heat sink 20 can be made, for example, of a plate member which is substantially oblong as a whole. In addition, the heat sink blocks 40 can be made, for example, rectangular plate members which are somewhat smaller in size than the semiconductor chips 10, 11 that are respectively joined thereto.

The heat sink blocks 40 serve to thermally and electrically connect especially the first semiconductor chip 10 and the upper heat sink 30, and to secure the height of the interval between the semiconductor chips 10, 11 and the upper heat sink 30 for such a purpose as securing the height of bonding wires 70 to be explained later, in the case of leading the wires 70 out of the first semiconductor chip 10.

Further, the upper heat sink 30 can be constructed of, for example, a substantially oblong plate member as a whole.

Here, the lower heat sink 20 and the upper heat sink 30 function to lead out the electrodes of the semiconductor chips 10, 11, that is, to electrically connect the semiconductor chips 10, 11 and the exterior of the semiconductor device S1, respectively. This can be easily realized by, for example, providing (not shown) terminal portions in both the heat sinks 20, 30.

In this manner, the lower heat sink 20 and the upper heat sink 30 are constructed as the first metal member and the second metal member serving as the electrodes and the radiation members, respectively. In the semiconductor device S1, the lower heat sink 20 and the upper heat sink 30 have the function of radiating heat from the semiconductor chips 10, 11, and they also function as the electrodes of the semiconductor chips 10, 11.

Besides, signal terminals 60 which are formed as a lead frame or the like are disposed around the first semiconductor chip 10. The signal terminals 60 are connected with signal electrodes (for example, gate electrodes) which are disposed on the principal front surface of the first semiconductor chip 10.

In this embodiment, the first semiconductor chip 10 and the signal terminals 60 are joined and electrically connected by wires 70. The wires 70 are laid by wire bonding or the like, and are made of gold, aluminum or the like.

Further, in this embodiment, substantially all of the semiconductor device S1 is encapsulated with the mold resin 80. Concretely, as shown in FIG. 1B, the interspace between the pair of heat sinks 20, 30 and a part around the semiconductor chip 10 as well as the heat sink block 40 periphery portions are filled up and molded with the resin 80.

An ordinary molding material, for example, epoxy resin can be adopted as the resin 80. Besides, the encapsulation of the heat sinks 20, 30, etc. with the resin 80 can be easily done by transfer molding which uses a mold assembly (not shown) comprised of upper and lower molds.

In this manner, the semiconductor device S1 of this embodiment is basically constructed as a semiconductor device of resin-molded type in which the metal members 20, 30 and 40 are electrically and thermally connected to the principal front and rear surfaces of the semiconductor chip 10 being the vertical power element, through the conductive adhesive agents 51–53.

Herein, the part of the semiconductor device S1 that is not the resin 80 in FIGS. 1A and 1B, that is, a laminated body which is not molded with the resin 80 in FIGS. 1A and 1B shall be termed "mounted portion 90".

In addition, the resin 80 plays two roles; the role of sealing the mounted portion 90 as well as the surrounding part thereof, in close contact therewith, thereby to protect the semiconductor chips 10, 11, and the role of securing an interval along the surfaces in order to hold the electrical insulation between the lower and upper heat sinks 20, 30 which are respectively exposed to the rear and front sides of the semiconductor device S1. Here, in order to obtain the interval along the surfaces, a thick-walled portion which is constructed only of the resin 80 is provided around the mounted portion 90.

In this embodiment, as a unique construction, resin-flow hindering portions 81 for hindering the flow of the resin 80 in the resin molding operation are provided in the thick-walled portion which lies at the peripheral part of the resin 80. In this embodiment, the resin-flow hindering portions 81 are holes 81 which are formed in the thick-walled portion of the resin 80.

In this example, each of the holes 81 being the resin-flow hindering portions is formed to extend from the surface of the semiconductor device S1 on the side of the upper heat sink 30, to the intermediate part of the semiconductor device S1 in the thickness direction thereof. In this embodiment, two holes 81 are provided on the gate side of the thick-walled portion as shown in FIG. 1A.

The holes 81 are formed by pins (convex parts) which protrude from the metal mold employed for the operation of molding the resin 80.

Next, a method of manufacturing the semiconductor device S1 of the above construction will be described with reference to FIGS. 1A and 1B. First, the step of soldering the semiconductor chips 10, 11 and the heat sink blocks 40 onto the upper surface of the lower heat sink 20 is executed.

In this case, the semiconductor chips 10, 11 are put on the upper surface of the lower heat sink 20 sandwiching solder foil made of, for example, an Sn-based solder, and the heat sink blocks 40 are put on the respective semiconductor chips 10, 11 sandwiching solder foils of the same sort.

Thereafter, the resulting structure is heated above the melting point of the solder by a heating device (reflow device), to thereby melt the solder foils. Further, the solder foils are hardened.

Subsequently, the step of wire-bonding the first semiconductor chip 10 and the signal terminals 60 is executed. Thus, the first semiconductor chip 10 and the signal terminals 60 are joined and electrically connected by the wires 70.

Subsequently, the step of soldering the upper heat sink 30 onto the heat sink blocks 40 is executed. In this case, the upper heat sink 30 is put on the heat sink blocks 40 sandwiching solder foil. Besides, the solder foil is melted by the heating device, and they are thereafter hardened.

When the molten solder foils have been hardened in due course, the hardened solder portions form the first, second and third conductive joint members 51, 52 and 53.

In addition, the joints and the electrical and thermal connections among the lower heat sink 20, semiconductor chips 10, 11, heat sink blocks 40 and upper heat sink 30 can be realized through the conductive joint members 51–53.

Incidentally, even when employing a conductive adhesive for the first, second and third conductive joint members 51, 52 and 53, the joints and the electrical and thermal connections among the lower heat sink 20, semiconductor chips 10, 11, heat sink blocks 40 and upper heat sink 30 can be realized by replacing the solder with the conductive adhesive at the above step and thus applying and hardening the conductive adhesive.

Thereafter, the step of filling up the interspace between the heat sinks 20, 30 and the surrounding part thereof with the resin 80 is executed using a metal mold not shown. Here in this embodiment, the metal mold is provided with pins corresponding to the holes 81, in order to form the holes 81 of the resin 80.

After the mounted portion 90 of the semiconductor device proper has been set in the metal mold, the resin 80 is poured through the gates of the metal mold. Here, a broken line in FIG. 1A indicates the initial filling state of the resin 80 poured through the gates. At the part of the resin 80 to become the thick-walled portion, the flow of this resin 80 is hindered by the pins corresponding to the holes 81.

In the metal mold, therefore, the velocity of the flow of the resin 80 at the part to become the thick-walled portion and the part to become the thin-walled portion can be made uniform to the utmost. Accordingly, the unbalance of the filling with the resin 80 can be suppressed in the metal mold.

Further, the final filling part substantially becomes the thick-walled portion opposite to the gates, that is, the outer part of the mounted portion 90, so that air bubbles are prevented from remaining in the resin 80 within the mounted portion 90.

In this way, as shown in FIGS. 1A and 1B, the interval between the heat sinks 20, 30 and the surrounding part thereof are filled up and molded with the resin 80. Besides, after the resin 80 has been hardened, the semiconductor device S1 is taken out of the metal mold, whereby the semiconductor device S1 is completed. On this occasion, the holes 81 serve as drawing-out holes for the pins of the metal mold.

By the way, in the case of the above construction, the semiconductor device S1 is encapsulated with the resin 80 so that the lower surface of the lower heat sink 20 and the upper surface of the upper heat sink 30 may be respectively exposed. Thus, the heat radiativities of the heat sinks 20, 30 are enhanced.

According to this embodiment, there is provided a semiconductor device S1 including semiconductor chips 10, 11 each of which has electrodes on a principal front surface and a principal rear surface, a lower heat sink 20 being a first metal member, which is joined on the principal rear surface side of the semiconductor chips 10, 11 and which serves as an electrode and a radiation member, and an upper heat sink 30 being a second metal member, which is joined on the principal front surface side of the semiconductor chips 10, 11 and which serves as an electrode and a radiation member, wherein substantially the whole device is encapsulated with a molded resin 80, characterized in that the thick-walled portion of the resin 80 lying at the peripheral part thereof is provided with holes 81 being resin-flow hindering portions which serve to hinder the flow of the resin 80 in the operation of molding the resin 80.

Since, according to this embodiment, the holes 81 being the resin-flow hindering portions are provided in the thick-walled portion of the resin 80 lying in the peripheral part thereof, the flow of the resin 80 can be made slower than in the prior art, at the part to become the thick-walled portion, and the velocity of the flow of the resin 80 at the part to become the thick-walled portion and the part to become the thin-walled portion can be made uniform to the utmost in the resin molding operation as explained above.

According to this embodiment, therefore, the air bubbles can be prevented from appearing in the resin 80 in the mounted portion 90 to the utmost in the semiconductor device S1 which has the dual-side-radiating molded structure.

Further, in this embodiment, the resin-flow hindering portions are the holes 81 which are formed in the thick-walled portion within the resin 80. In this case, the holes 81 can be easily formed in the thick-walled portion within the resin 80 if pins which are the convex parts corresponding to the holes 81 are provided in the metal mold. In this case, the flow of the resin 80 is hindered in such a manner that the resin 80 collides against the pins of the metal mold.

Second Embodiment

Figure 2A:
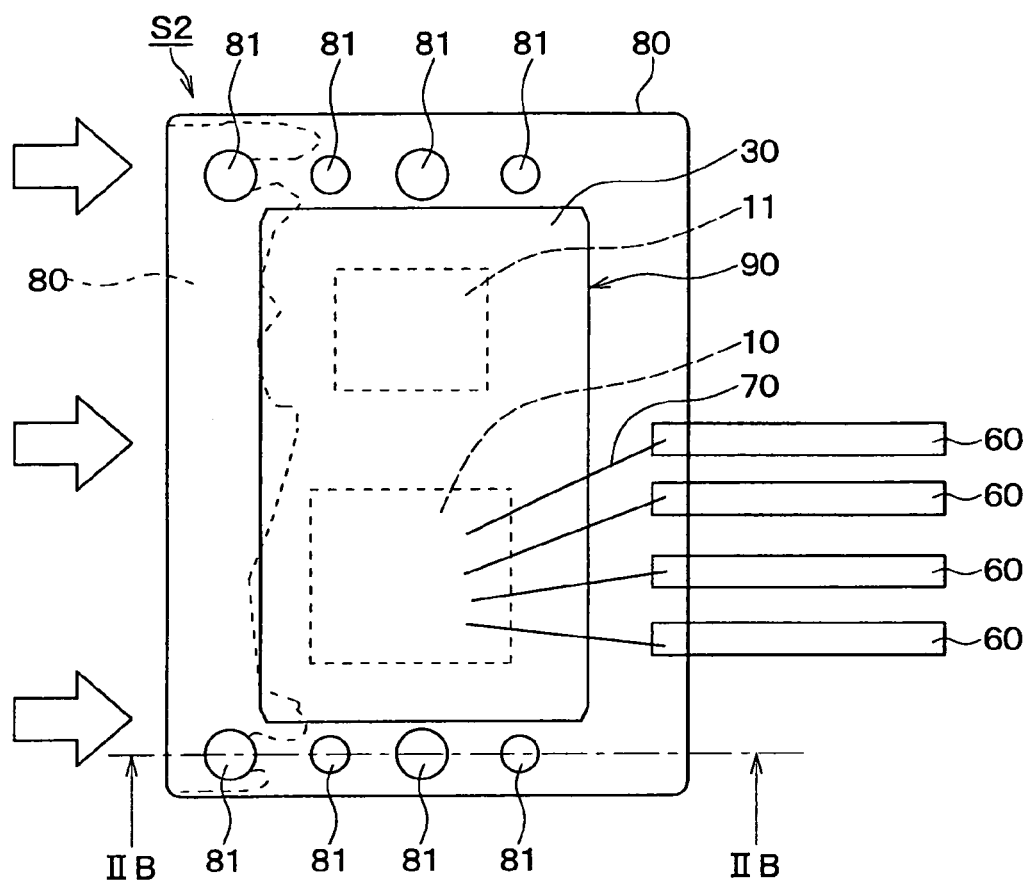
Figure 2B:
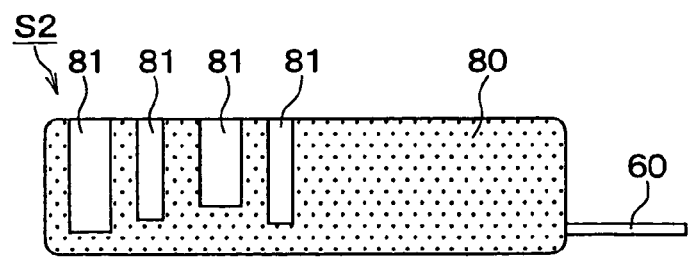

FIGS. 2A and 2B illustrate the schematic construction of a semiconductor device S2 according to the second embodiment, in which FIG. 2A is a schematic plan view showing the planar arrangement of individual portions, and FIG. 2B is a schematic sectional view taken along line IIB—IIB in FIG. 2A.

As shown in FIGS. 2A and 2B, this embodiment consists in that the number of holes 81 being resin-flow hindering portions is enlarged more than in the first embodiment. In the example shown in FIG. 2A, four holes 81 are provided on each of the upper and lower sides as viewed in the figure, in the thick-walled portion of a resin 80. The sizes or depths of the individual holes 81 may be either the same or different.

According to this embodiment, a larger number of holes 81 are provided in this manner, whereby the effect of hindering a resin flow can be further enhanced.

Third Embodiment

Figure 3A:
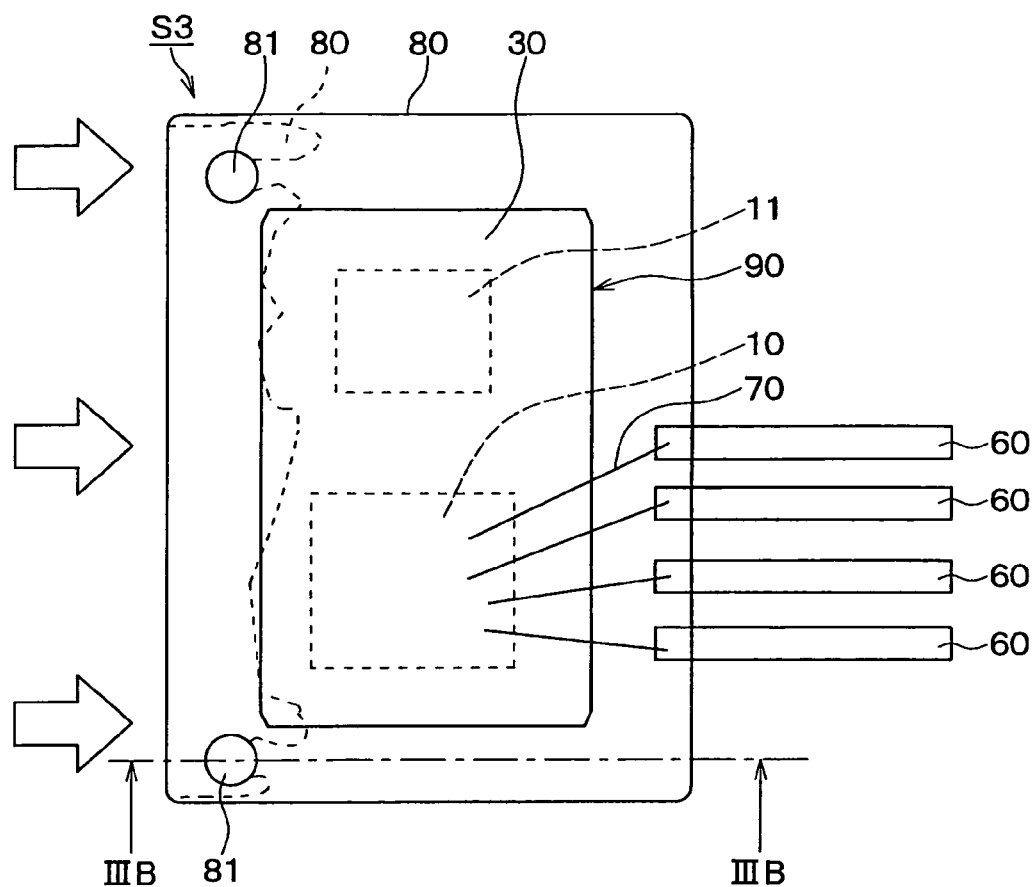
Figure 3B:
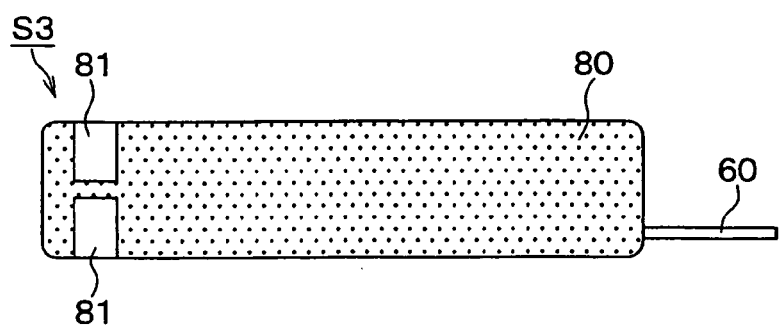

FIGS. 3A and 3B illustrate the schematic construction of a semiconductor device S3 according to a third embodiment, in which FIG. 3A is a schematic plan view showing the planar arrangement of individual portions, and FIG. 3B is a schematic sectional view taken along line IIIB—IIIB in FIG. 3A.

As shown in FIGS. 3A and 3B, the number of holes 81 being resin-flow hindering portions is enlarged more than in the first embodiment.

In this embodiment, as shown in FIG. 3B, the holes 81 are formed so as to extend from the surface of the semiconductor device S3 on the side of an upper heat sink 30 and the surface on the side of a lower heat sink 20, to the intermediate parts of the semiconductor device S3 in the thickness direction thereof, respectively.

Also here, the sizes or depths of the individual holes 81 may be either the same or different. Also in this embodiment, by providing the larger number of holes 81, the effect of hindering a resin flow can be enhanced more.

Fourth Embodiment

Figure 4A:
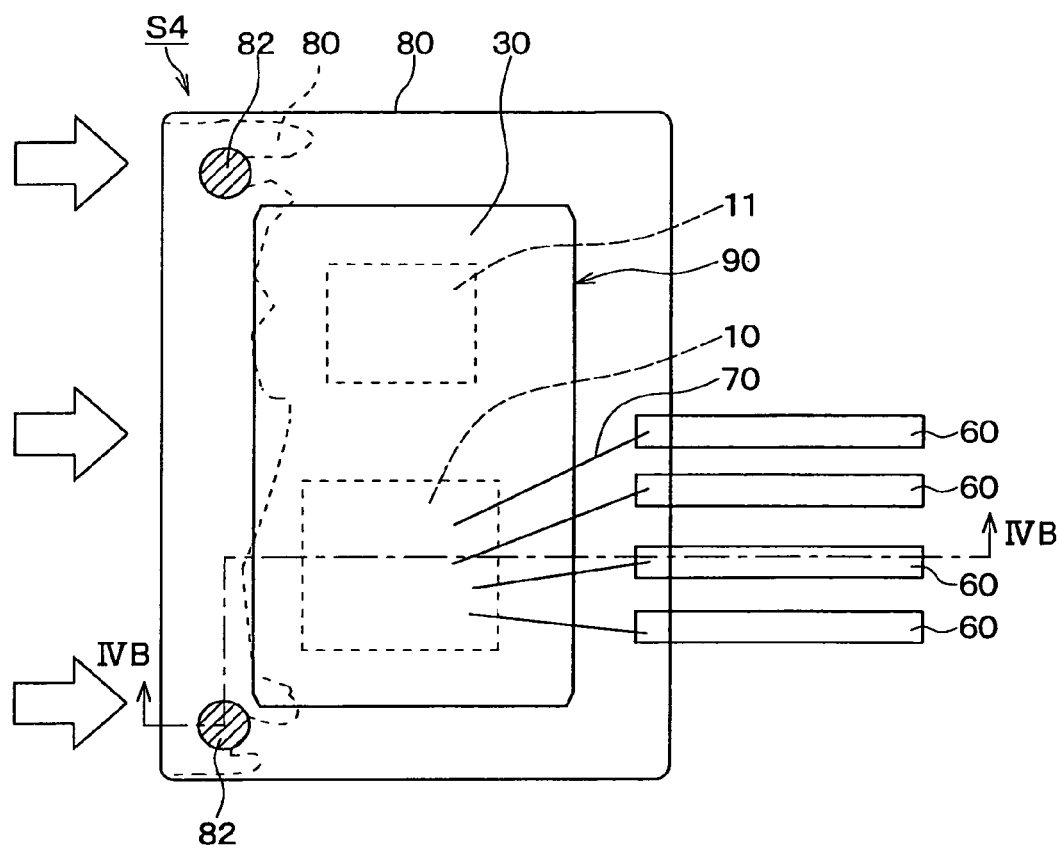
Figure 4B:
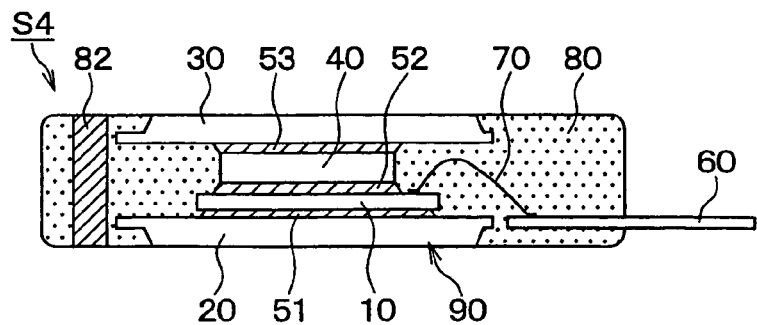

FIGS. 4A and 4B illustrate the schematic construction of a semiconductor device S4 according to the fourth embodiment, in which FIG. 4A is a schematic plan view showing the planar arrangement of individual portions, and FIG. 4B is a schematic sectional view taken along line IVB—IVB in FIG. 4A.

In this embodiment, the shape of the resin-flow hindering portions is modified, in comparison to the first embodiment.

As shown in FIGS. 4A and 4B, each of the resin-flow hindering portions in this embodiment is formed of an insulator 82 which is embedded in a through hole that penetrates through the semiconductor device S4 in the thickness direction thereof in a thick-walled portion within a resin 80.

The insulator 82 is made of a resin, ceramics or the like the melting point of which is higher than that of the resin 80. In this example, the insulator 82 is columnar.

In this case, when the insulator portions 82 are sandwiched in between upper and lower molds, they can be fixed and set within a metal mold comprised of the upper and lower molds. The resin 80 is poured through the gates of the metal mold in this state, whereby the flow of this resin 80 is hindered by the insulator portions 82 as in the case of the pins of the metal mold explained in the first embodiment.

The resin-flow hindering portions in which the insulator material 82 is embedded in the through holes are consequently formed in the thick-walled portion within the resin 80 after the molding.

That is, according to this embodiment, the same functional effects as in the first embodiment are attained. Moreover, there is the advantage that the metal mold in the prior art as left intact can be used without especially altering the construction thereof.

Fifth Embodiment

Figure 5A:
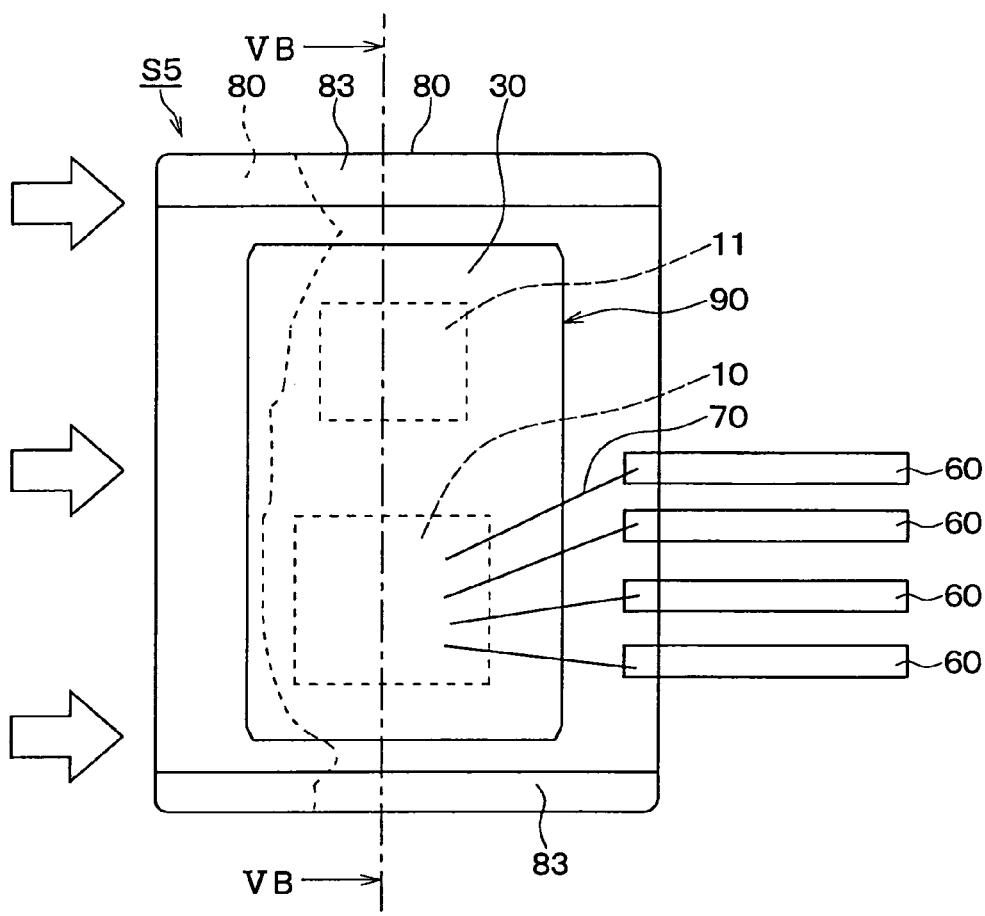
Figure 5B:
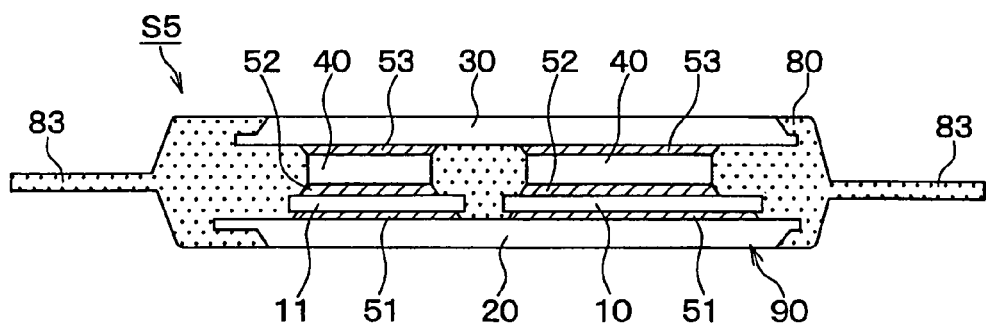

FIGS. 5A and 5B illustrate the schematic construction of a semiconductor device S5 according to the fifth embodiment, in which FIG. 5A is a schematic plan view showing the planar arrangement of individual portions, and FIG. 5B is a schematic sectional view taken along line VB—VB in FIG. 5A.

In this embodiment, the shape of the resin-flow hindering portions is modified in comparison to the first embodiment. As shown in FIGS. 5A and 5B, the resin-flow hindering portions in this embodiment are thin-walled portions 83 where the outer peripheral parts of the thick-walled portion in a resin 80 are thinned. In this example, the thin-walled portions 83 are formed at those end surfaces of the resin 80 which extend along the flow of this resin 80 from the gates of a metal mold.

Also in this case, the thin-walled portions 83 being the resin-flow hindering portions can be easily formed at the peripheral parts of the thick-walled portion in the resin 80 by altering the shape of the metal mold in correspondence with the thin-walled portions 83. Besides, the interval along the surfaces explained before is easily secured by appropriately setting the widthwise dimensions of the thin-walled portions 83.

In this embodiment, the same functional effects as in the first embodiment can be attained. Moreover, the concentration of the resin 80 into the thick-walled portion can be avoided, and the filling quantity of the resin 80 can be decreased, so that the embodiment is economical.

Sixth Embodiment

Figure 6A:
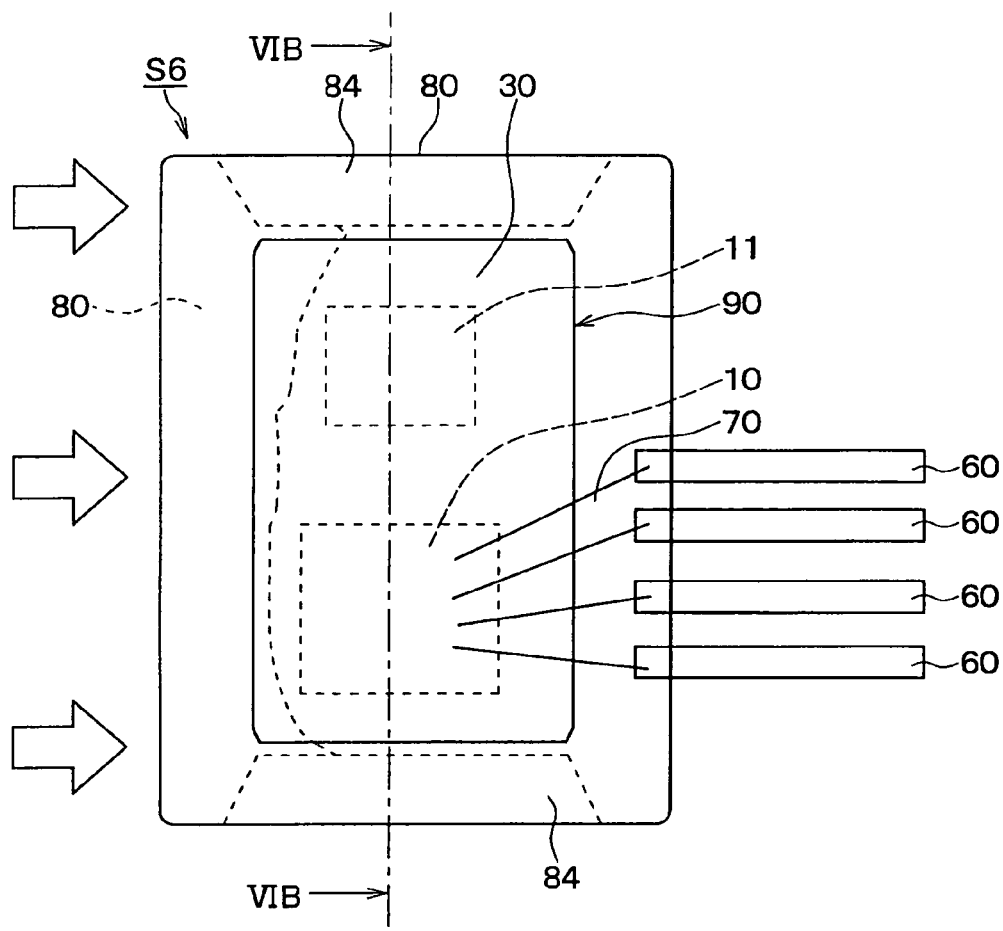
Figure 6B:
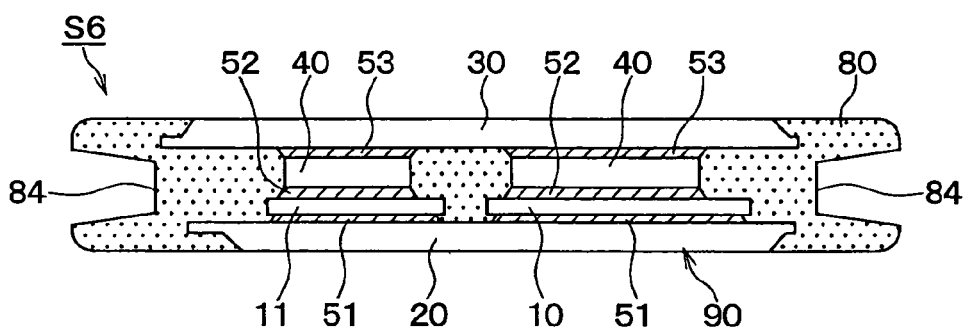

FIGS. 6A and 6B illustrate the schematic construction of a semiconductor device S6 according to the sixth embodiment, in which FIG. 6A is a schematic plan view showing the planar arrangement of individual portions, and FIG. 6B is a schematic sectional view taken along line VIB—VIB in FIG. 6A.

In this embodiment also, the shape of the holes which constitute the resin-flow hindering portions is modified in comparison to the first embodiment. As shown in FIGS. 6A and 6B, the holes 84 being the resin-flow hindering portions in this embodiment are recesses 84 which are formed in the end surfaces of a thick-walled portion in a resin 80. In this example, the recesses 84 are respectively formed in those end surfaces of the resin 80 which extend along the flow of this resin 80 from the gates of a metal mold.

Figure 7:
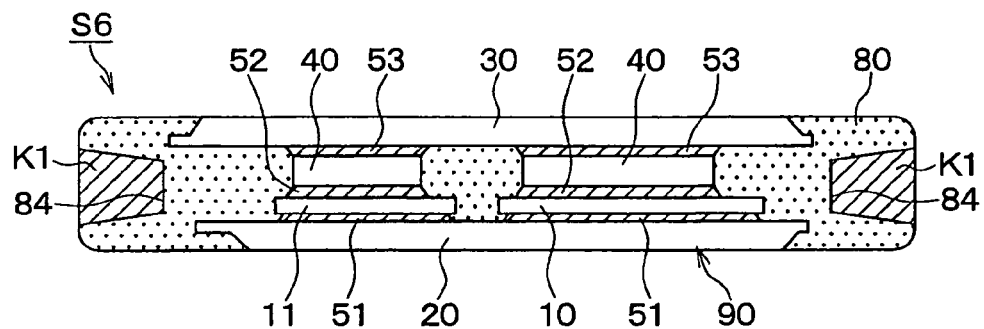
FIG. 7 is a schematic sectional view showing the state of the semiconductor device of the sixth embodiment during resin molding, together with protrusions in a metal mold.
Figure 10:
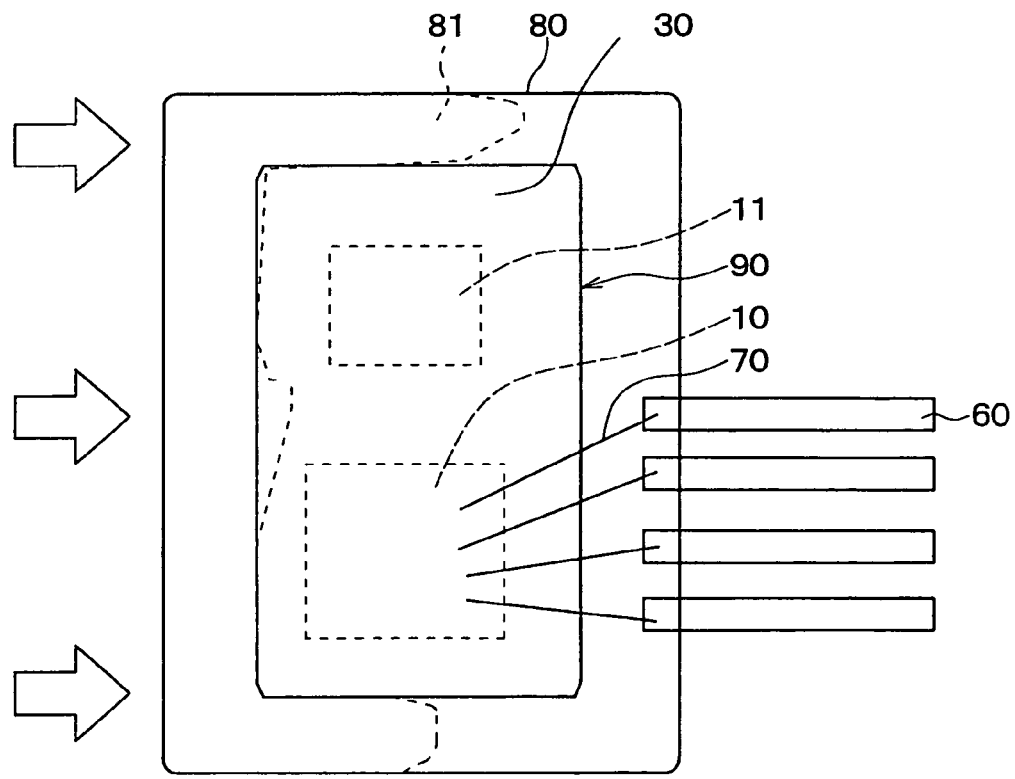
FIG. 10 is a schematic plan view showing the state of the semiconductor device shown in FIGS. 9A and 9B, during the resin molding thereof.

Such recesses 84 can be realized in such a way that the metal mold in a resin molding operation is provided with protrusions by liners or slides. FIG. 7 is a schematic sectional view showing the state of the semiconductor device S6 of this embodiment during the molding operation, together with the protrusions K1 in the metal mold.

Also in this embodiment, the metal mold is provided with convex parts which correspond to the recesses 84 being the holes, like the protrusions K1, whereby these recesses 84 can be easily formed in the thick-walled portions within the resin 80.

Besides, also in this case, the flow of the resin 80 is hindered by the collisions thereof against the protrusions K1 of the metal mold, so that the same effects as in the first embodiment can be attained.

Seventh Embodiment

Figure 8A:
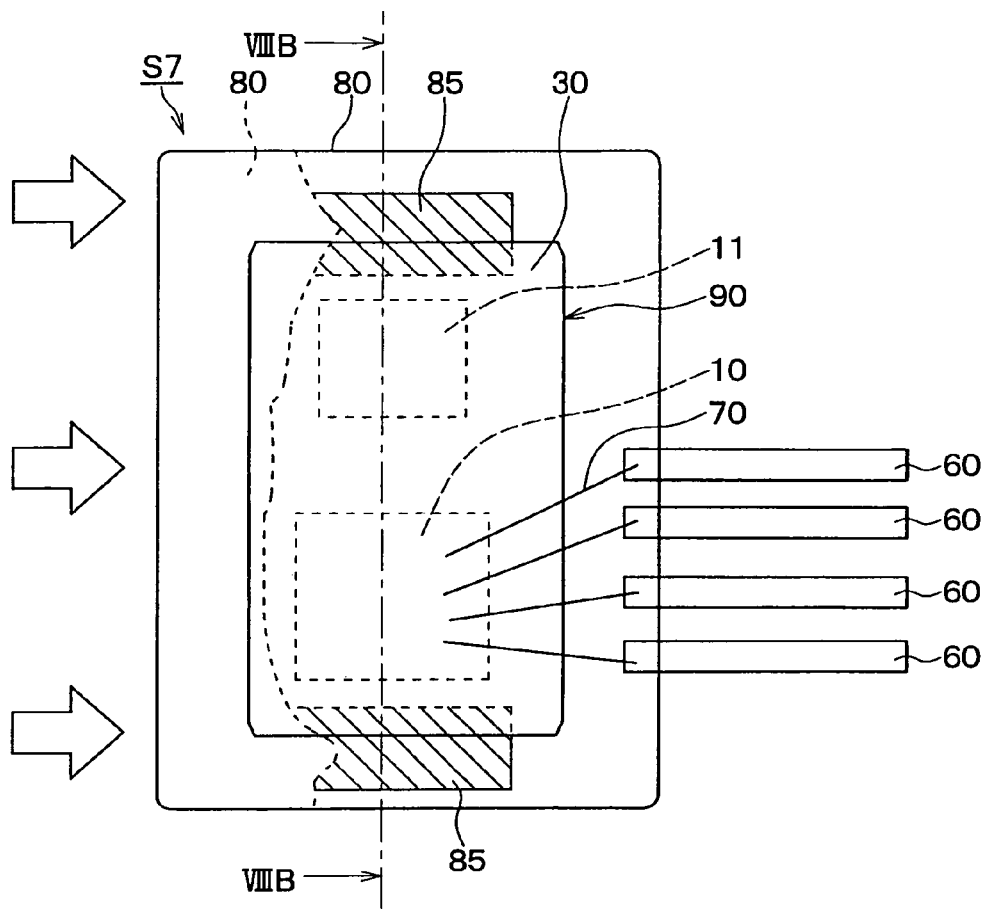
Figure 8B:
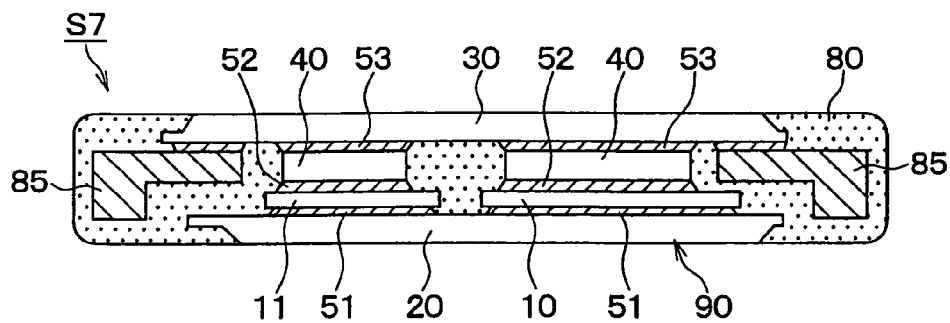
Figure 9A:
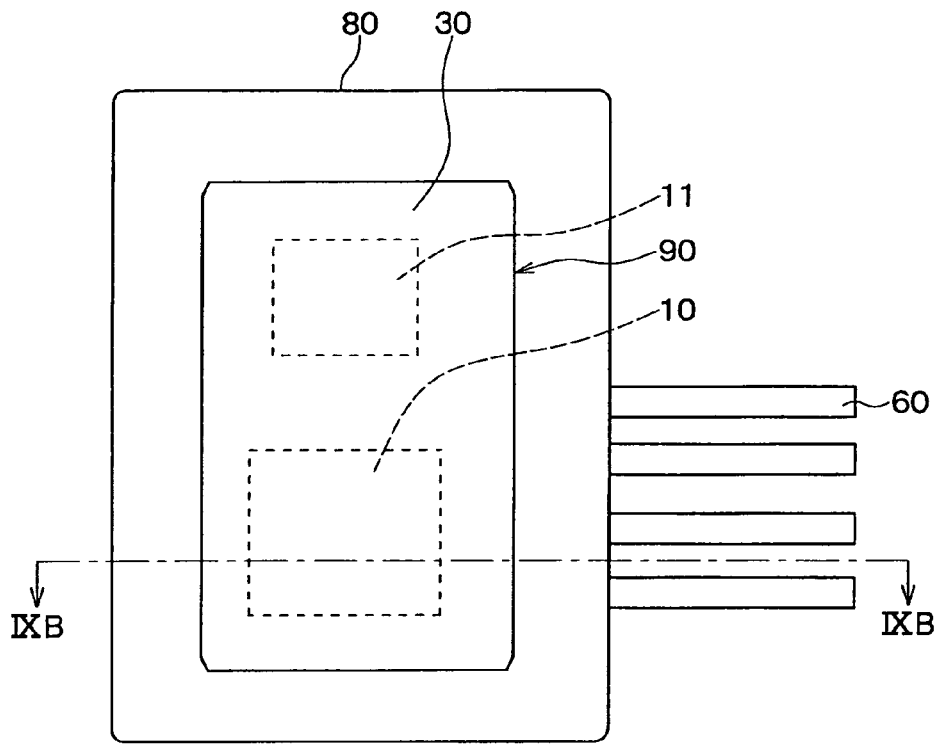
Figure 9B:
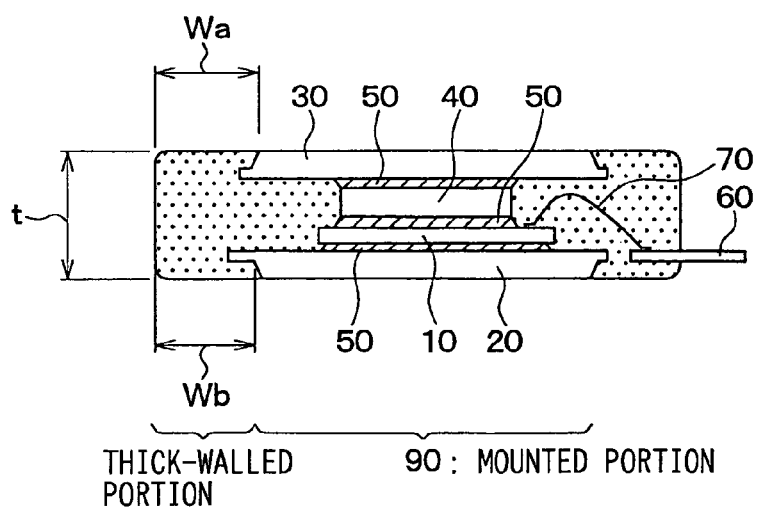

FIGS. 8A and 8B illustrate the schematic construction of a semiconductor device S7 according to the seventh embodiment, in which FIG. 8A is a schematic plan view showing the planar arrangement of individual portions, and FIG. 8B is a schematic sectional view taken along line VIII—VIII in FIG. 8A.

In this embodiment, the resin-flow hindering portions are modified in comparison to the first embodiment. As shown in FIGS. 8A and 8B, the resin-flow hindering portions in this embodiment are metal pieces 85 which are embedded in a thick-walled portion within a resin 80. In this example, in those thick-walled parts of the resin 80 which extend along the flow of the resin 80 from the gates of a metal mold, the metal pieces 85 are arranged so as to extend in the same direction.

Here, since the resin-flow hindering portions are made the metal pieces 85, they can be soldered to metal members, namely, heat sinks 20, 30 in a mounted portion 90, or they can be molded integrally with the heat sinks 20, 30.

In this example, the metal pieces 85 are soldered to the upper heat sink 30, thereby to be fixed to the mounted portion 90. Besides, in this case, the flow of the resin 80 is hindered by the metal pieces 85 in a resin molding operation.

In this manner, also in this embodiment, the same functional effects as in the first embodiment are attained. Moreover, the resin-flow hindering portions can be formed merely by setting the mounted portion 90, to which the metal pieces 85 are fixed, inside the metal mold and then pouring the resin 80, to bring forth the advantage that the metal mold in the prior art as left intact can be used without especially altering the construction thereof.

In the case where the metal pieces 85 are formed to be integral with the heat sink 20 or 30, the volume of this heat sink 20 or 30 being a radiation member is increased to bring forth the advantage that the thermal resistance of the heat sink 20 or 30 is lowered.

Other Embodiments

In each of the above embodiments, the heat sink blocks 40 are interposed between the semiconductor chips 10, 11 and the upper heat sink 30. The heat sink blocks thermally and electrically connect the semiconductor elements and the heat sink (radiation plate), and secure the height of the interval between the semiconductor elements and the radiation plate for such a purpose as securing the height of bonding wires in the case of leading the wires out of the first semiconductor elements.

Here, during a construction which does not require the heat sink blocks, these heat sink blocks may well, of course, be omitted.

The seventh embodiment may be modified to have a mounted portion to which electrical insulating pieces such as ceramics are fixed instead of the metal pieces by adhesion or the like may well be put into the metal mold so as to perform the pouring of the resin.

As thus far described, an essential point in that, in order to prevent air bubbles from appearing in a resin within a mounted portion in a semiconductor device having a dual-side-radiating molded structure, resin-flow hindering portions are provided in the thick-walled portion of the resin lying at the peripheral part of the semiconductor device. The other points are capable of appropriate design alterations even otherwise than in the foregoing embodiments.

What is claimed is:

1. A semiconductor device including:
   semiconductor elements which have electrodes on a principal front surface and a principal rear surface, respectively;
   a first metal member which is joined on a principal rear surface side of the semiconductor elements, and which serves as an electrode and a radiation member; and
   a second metal member which is joined on a principal front surface side of the semiconductor elements, and which serves as an electrode and a radiation member;
   wherein substantially the whole device is encapsulated with a molded resin; comprising:
   resin-flow hindering portions for hindering a flow of the resin during molding thereof, which portions are provided in a thick-walled portion of the resin lying at a peripheral part of said semiconductor device.

2. A semiconductor device as defined in claim 1, wherein said resin-flow hindering portions are holes which are formed in the thick-walled portion within the resin.

3. A semiconductor device as defined in claim 2, wherein said holes are recesses which are formed in end surfaces of the thick-walled portion within the resin.

4. A semiconductor device as defined in claim 1, wherein said resin-flow hindering portions are insulator portions which are embedded in through holes that penetrate through said device in a thickness direction thereof, in the thick-walled portion within the resin.

5. A semiconductor device as defined in claim 1, wherein said resin-flow hindering portions are thin-walled portions where outer peripheral parts of the thick-walled portion in the resin are thinned.

6. A semiconductor device as defined in claim 1, wherein said resin-flow hindering portions are metal pieces which are embedded in the thick-walled portion within the resin.

7. A semiconductor device as defined in claim 6, wherein said metal pieces are formed to be integral with the first metal member or the second metal member.

8. A semiconductor device as defined in claim 1, wherein the second metal member is joined to the principal front surface of the semiconductor elements in a state where third metal members are interposed between said second metal member and the principal front surface of the semiconductor elements.

* * * * *